United States Patent
Booth, Jr.

(10) Patent No.: US 6,597,398 B1
(45) Date of Patent: *Jul. 22, 2003

(54) IMAGE SENSOR RESPONSE ENHANCEMENT USING FLUORESCENT PHOSPHORS

(75) Inventor: Lawrence A. Booth, Jr., Phoenix, AZ (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/325,005

(22) Filed: Jun. 2, 1999

(51) Int. Cl.$^7$ ................................................ H04N 3/14
(52) U.S. Cl. ...................................... 348/272; 348/294
(58) Field of Search ........................... 348/272, 164, 348/33, 294; 250/370.08, 370.09, 484.4, 487.1, 483.1; 378/98.8; 257/294

(56) References Cited

U.S. PATENT DOCUMENTS

| | | | | |
|---|---|---|---|---|
| 4,603,259 A | * | 7/1986 | Rabatin | 250/487.1 |
| 5,079,423 A | * | 1/1992 | Hagiwara et al. | 250/483.1 |
| 5,412,705 A | * | 5/1995 | Snoeren et al. | 250/487.1 |
| 5,631,704 A | * | 5/1997 | Dickinson et al. | 348/294 |
| 5,990,506 A | * | 11/1999 | Fossum et al. | 257/294 |
| 6,014,164 A | * | 1/2000 | Woodgate et al. | 348/51 |
| 6,064,069 A | * | 5/2000 | Nakano et al. | 250/370.08 |
| 6,168,853 B1 | * | 1/2001 | Feng et al. | 428/207 |
| 6,208,393 B1 | * | 3/2001 | Bawolek et al. | 349/106 |

FOREIGN PATENT DOCUMENTS

| | | | | |
|---|---|---|---|---|
| EP | 0843 363 A1 | | 5/1998 | ....... H01L/31/0232 |
| JP | 02276996 A | * | 11/1990 | ........... H04N/5/32 |
| JP | 04322467 | | 11/1992 | ........... H01L/27/14 |
| JP | 04326763 | | 11/1992 | ........... H01L/27/14 |
| JP | 10149776 A | * | 6/1998 | ........... H01J/11/02 |
| WO | PCT/US97/00927 | | 1/1997 | |

OTHER PUBLICATIONS

"CMOS Image Sensors: Eclipsin CCD'S in Visual Information?", Stephen Kempainen (Technical Editor), www.ednmag.com, pp. 101–119.

"The physics of semiconductor devices (second edition)", Wiley, *BNSDOCID: XP–002147554*, pp. 749–752.

* cited by examiner

Primary Examiner—Wendy R. Garber
Assistant Examiner—Luong Nguyen
(74) Attorney, Agent, or Firm—Blakely, Sokoloff, Taylor & Zafman LLP

(57) ABSTRACT

A method and apparatus is described that is related to image response enhancement of image sensors. In an image sensor, a phosphor layer is placed between the incident photons and the image sensor in which the phosphor layer converts incident photons from a first wavelength to a second wavelength.

19 Claims, 7 Drawing Sheets

IMAGE SENSOR RESPONSE ENHANCEMENT USING FLUORESCENT PHOSPHORS

I. FIELD OF THE INVENTION

The present invention relates to light response enhancement of image sensors.

II. BACKGROUND INFORMATION

Due to its many advantages, Complementary Metal Oxide Semiconductor (CMOS) image sensors have been of interest as replacements for charged coupled devices (CCDs) in imaging applications. A CMOS image sensor generally uses a single low power supply and has a simpler system level design with high functional integration when compared with a CCD image sensor. These factors contribute to lowering system costs while providing for a potential camera on a chip. Such features are highly desirable, for example, in camcorders and digital cameras, where the devices may be reduced to a size of a TV remote control and are highly portable. Additionally, high resolution color images can be recorded for hours on battery power because the CMOS image sensor has a low power consumption.

The CMOS image sensor can be generally divided broadly into two categories dependent on the type of pixel array used, the first category being the passive pixel array and the second category being the active pixel array. In the passive pixel array, each pixel merely collects the charge generated by the photodiode and transfers the collected charge to the imaging circuitry for image processing. The active pixel array, on the other hand, includes an amplification circuitry in each pixel to amplify the signal represented by the charge generated by the photodiode before transferring to the image circuitry for processing. The advantage of the passive pixel array over the active pixel array is that each pixel has minimal components allowing for a high fill factor which in turn produces a high quantum efficiency. Fill factor generally refers to the ratio of photo sensitive area to the pixel's overall size. Quantum efficiency is a measure of light sensitivity and refers to the ratio of photon generated electrons that a pixel captures to the photon incident over the pixel area. However, one of the disadvantages of the passive pixel array is that the charge levels generated may be low and thereby insufficient to drive the image circuitry to produce high quality images. In the active pixel array, the pixel amplifies the signal represented by the charge and is sufficiently able to drive the image circuitry. However, due to several components being used for amplification, the fill factor is generally low which in turn affects the quantum efficiency. The active pixel array generally compensates for the low quantum efficiency by using microlenses to focus the photons into the sensitive area of the pixels that may otherwise strike the insensitive area of the pixels. Microlenses, however, are expensive and generally drives up the cost of manufacturing the active pixel array sensor.

The CMOS image sensor technology is by no means a new technology and both the CMOS image sensor and the CCD image sensor were developed at about the same period. While there were many advantages to using a CMOS image sensor over a CCD image sensor (as described above), the CCD image sensor has prevailed over the CMOS image sensor in imaging applications. One major reason is that the CMOS image sensor has not been able to match the quality of the image generated by the CCD, that is, light sensitivity has been one issue in which the CCD image sensor has prevailed over the CMOS image sensor. The CMOS image sensor, however, is now rapidly gaining wide acceptance due to increased light sensitivity obtained using various complicated and expensive enhancement technologies. However, from a cost point of view, the low cost advantage of the CMOS image sensor has severely eroded when compared with the cost the CCD image device due to the enhancement technologies. It is desired to boost the light sensitivity of a CMOS sensor so that better quality images may be produced and where possible, maintain the cost advantage of the CMOS sensor.

SUMMARY

A method and apparatus is described that is related to light response enhancement of image sensors. A phosphor layer is placed between the incident photons and the image sensor in which the phosphor layer converts incident photons from a first wavelength to a second wavelength.

Other features and advantages of the present invention will be apparent from the accompanying drawings and detailed description to be followed.

BRIEF DESCRIPTION OF THE DRAWINGS

The present invention is illustrated by way of examples and not as limitations in the figures of the accompanying drawings in which.

DETAILED DESCRIPTION

A method and an apparatus is described that enhances an image response of an image sensor. In one embodiment, in an image sensor having a pixel array, where each pixel is configured to convert incident light into electrical charges, a phosphor layer is placed between the pixel array and the incident light. The phosphor layer absorbs the incident light and re-radiates the light at a wavelength that corresponds to the optimal quantum efficiency of the image sensor. To aid in the understanding of the invention, a brief description is given below on the operation of a pixel in a CMOS image sensor which should not be construed as a limitation.

Figure 1:
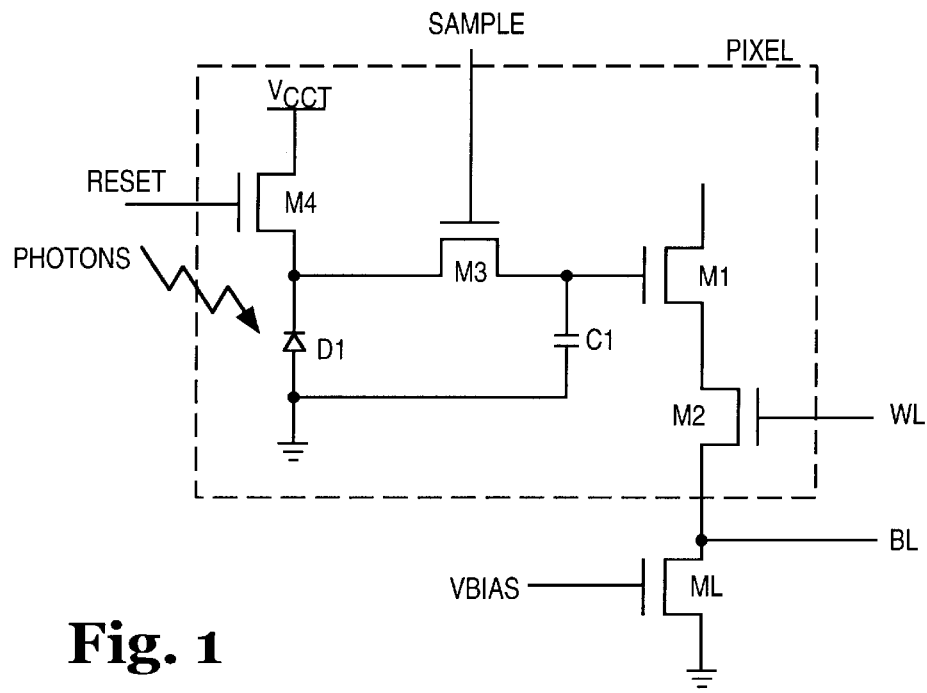
FIG. 1 is a schematic diagram of a pixel in a pixel array of an exemplary CMOS image sensor.

FIG. 1 illustrates a schematic diagram of a pixel of an exemplary CMOS image sensor having an active pixel array. The operation of the pixel will now be described. The transistor M4 is used to precharge the photodiode D1 to reset power (herein $V_{CCT}$). Photons falling on the photodiode D1 generate electron-hole pairs and the electrons are collected by a N type well, driving the diode D1 to a lower voltage. This voltage is a function of the light intensity and the time since precharge, commonly referred to as the integration time. Sampling transistor M3 and storage capacitor C1 provide the "electronic shutter", that is, when the deassertion of the SAMPLE signal is applied to transistor M3, the storage capacitor C1 is isolated from the photodiode D1, capturing the instant analog voltage across the photodiode D1. The transistor M2 is the access device and the transistor M1 comprises the top of a source-follower. The load device ML is common to each bit line.

Figure 2:
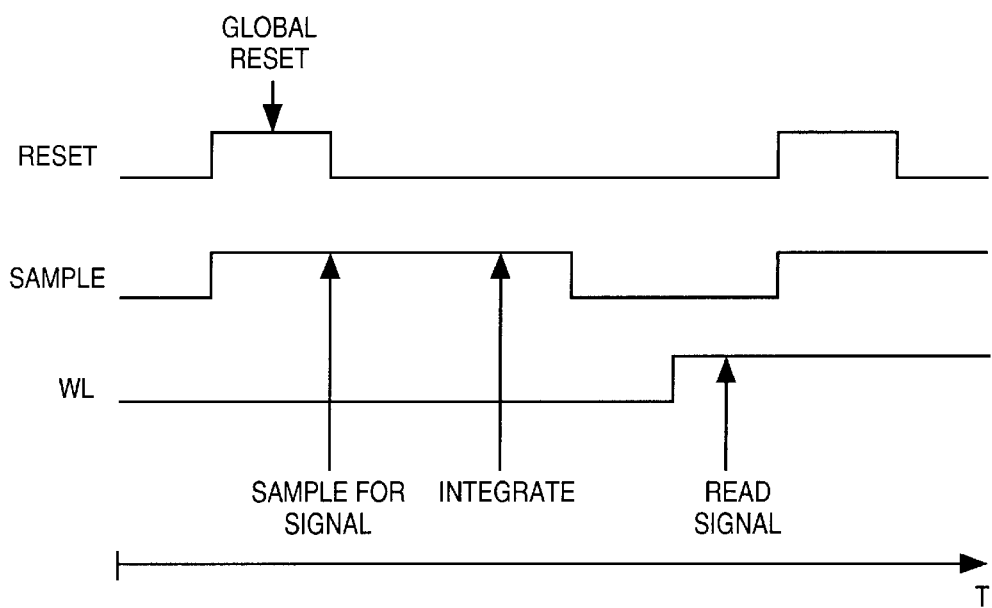
FIG. 2 is a timing diagram of the pixel illustrated in FIG. 1.

FIG. 2 illustrates a timing diagram that further aids in the explanation of the operation of the pixel of FIG. 1. Initially, RESET is asserted on the transistor M4, precharging the photodiode D1 to approximately $V_{CCT}$. SAMPLE is asserted simultaneously with RESET allowing the storage capacitor C1 to precharge to the same voltage level as the photodiode D1. Integration begins with the deassertion of the RESET turning off transistor M4 and allowing the photons falling on the photodiode D1 to dictate the voltage drop across the photodiode D1. Since SAMPLE is still asserted, the voltage drop of the storage capacitor C1 corresponds to the voltage drop across the photodiode D1. With the deassertion of SAMPLE, thereby, turning off transistor M3, the storage capacitor C1 is isolated from the photodiode D1 capturing the instant voltage drop across the photodiode D1. Readout is performed on a row by row basis by asserting the Wordline WL which turns on transistor M2 allowing the voltage drop across the storage capacitor C1 to be asserted across the load device ML and driving the Bitline BL on each pixel in the row.

Figure 3:
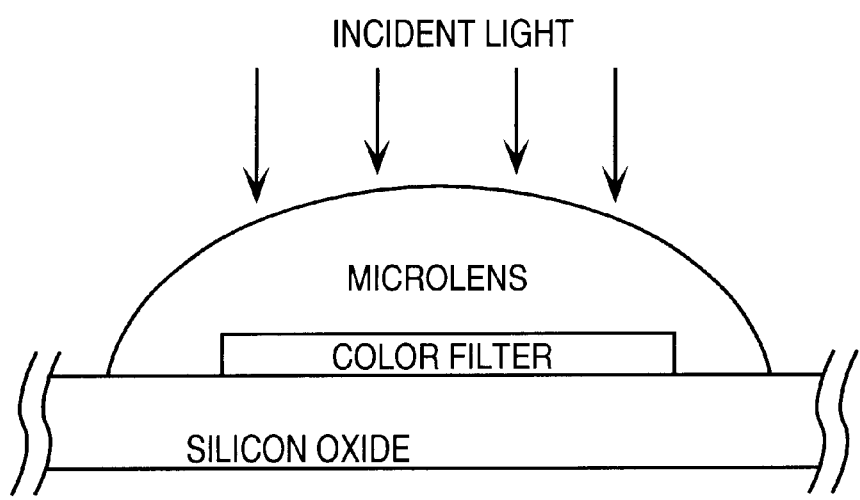
FIG. 3 is a cross-sectional view of a pixel including a color filter and microlens.

As described above, the CMOS image sensor captures images based on photoelectric principles. Photons striking the light sensitive area of the silicon causes electrons to be released proportional to the light intensity. Stated differently, in one method, the light sensitivity of the CMOS sensor can be determined by the light intensity that is able to reach the photosensitive area of the pixels. However, to distinguish color, according to one method, various color filters are applied to the surface of the pixel array which affects the light sensitivity of the CMOS sensor as will be described further below. In one method, the color filter array separates the colors of the incident light such that one primary color (i.e., red, green or blue) falls on each pixel of the pixel array. Thus, the position of each filter in the color filter array determines the pattern to be captured by the pixels in the pixel array. Each pixel captures the filtered incident light as electrical charges that are converted into a voltage signal to be processed by the imaging circuitry. Color filters are generally applied to the surface of the pixel array using existing commercial color filter array (CFA) materials. In this configuration, however, the filter array generally blocks out roughly two-thirds of the light intensity that is detectable by the sensor and thus, reduces the light sensitivity of the sensor. To increase the light sensitivity of the pixel array, according to one method, microlenses are deposited on the surface of the sensor. The microlenses allow photons to be focused into the photo sensitive area of the pixel which would otherwise fall on the insensitive area of the pixel. In this manner, the effective fill factor of the sensor can be doubled or tripled, dependent on the efficiency of the microlenses. FIG. 3 illustrates such configuration as described above.

Figure 4:
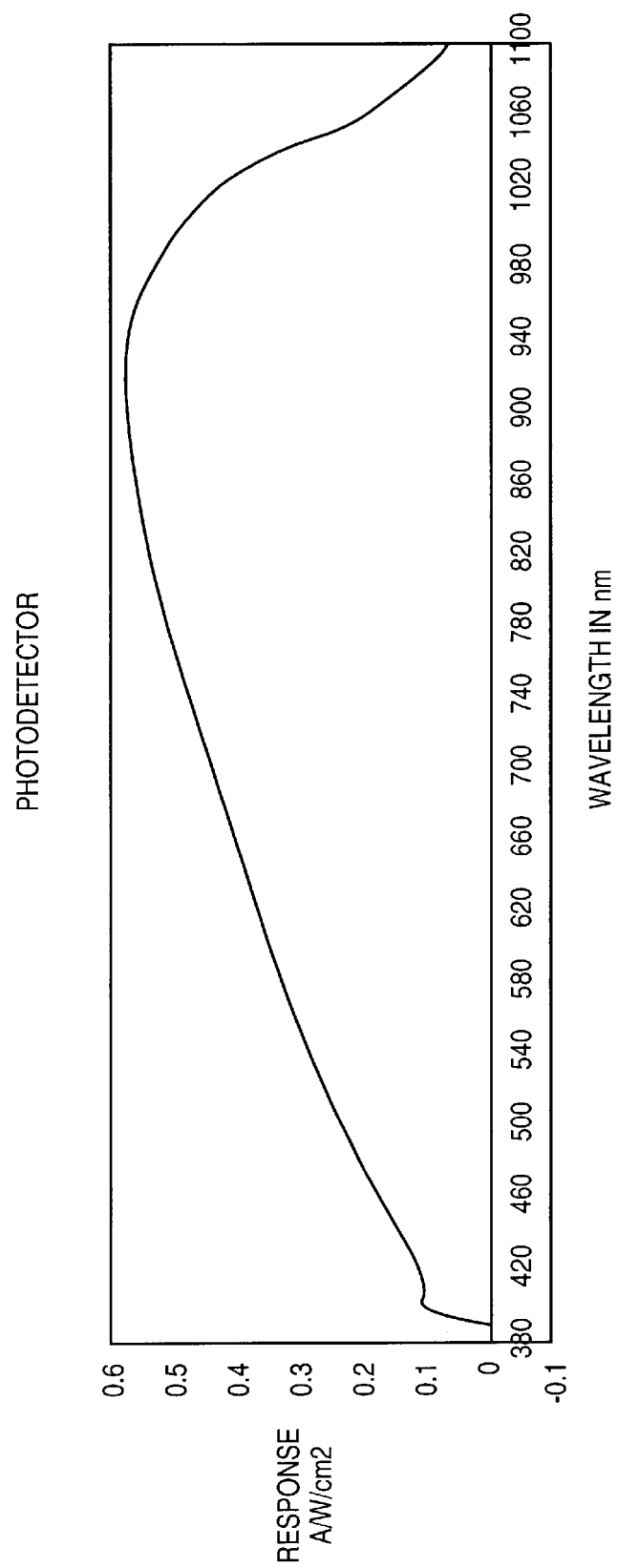
FIG. 4 is a diagram of a response spectrum of an exemplary CMOS image sensor made of silicon.

FIG. 4 shows a spectral response of an exemplary CMOS image sensor made of silicon. The CMOS image sensor generally has an optimal quantum response in the range of 900–1000 nanometers (nm). Stated differently, the CMOS image sensor operates at optimal quantum efficiency in the infra-red wavelengths. Where the CMOS sensor is converting light in the visible spectrum into electrical charges, the conversion is not being performed efficiently and thus, CMOS sensor is not operating at optimal quantum efficiency. Therefore, it is desirable to operate the CMOS sensor in the optimal quantum efficiency spectrum.

Figure 5:
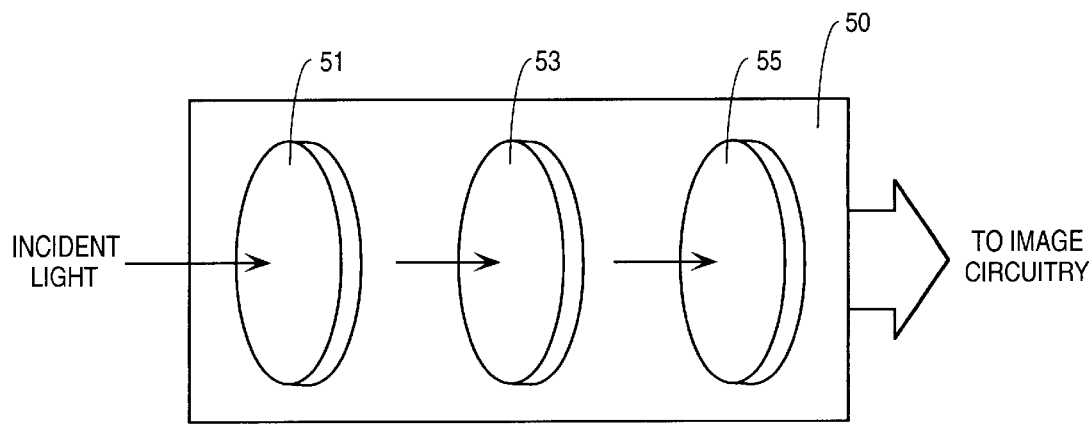
FIG. 5 illustrates a CMOS image sensor comprising a color filter array, a phosphor layer and a pixel array in accordance with an embodiment of the invention.

FIG. 5 illustrates a CMOS image sensor 50 in accordance with an embodiment of the invention. The CMOS sensor 50 comprises a color filter array 51 and a pixel array 55. Between the color filter array 51 and the pixel array 55 there is a phosphor layer 53 which absorbs the visible light passing through the color filter array 51 and shifts the energy to a wavelength that corresponds to the optimal quantum efficiency of the CMOS pixel array 55. The principle is similar to that of a fluorescent tube in which phosphors coated in the inner surface of the tube absorbs the ultraviolet light generated by the fluorescent tube and re-radiates as visible light. Similarly, within the image sensor 50, light that is passed through the color filter array 51 is absorbed by the phosphor layer 53 and is re-radiated in the infra-red spectrum where the pixel array 55 operates at optimal quantum efficiency. Generally, the silicon of the photodiode in the pixel array is more sensitive in the infrared spectrum than in the visible light spectrum. The phenomena corresponds to the principles of solid state physics.

Figure 6:
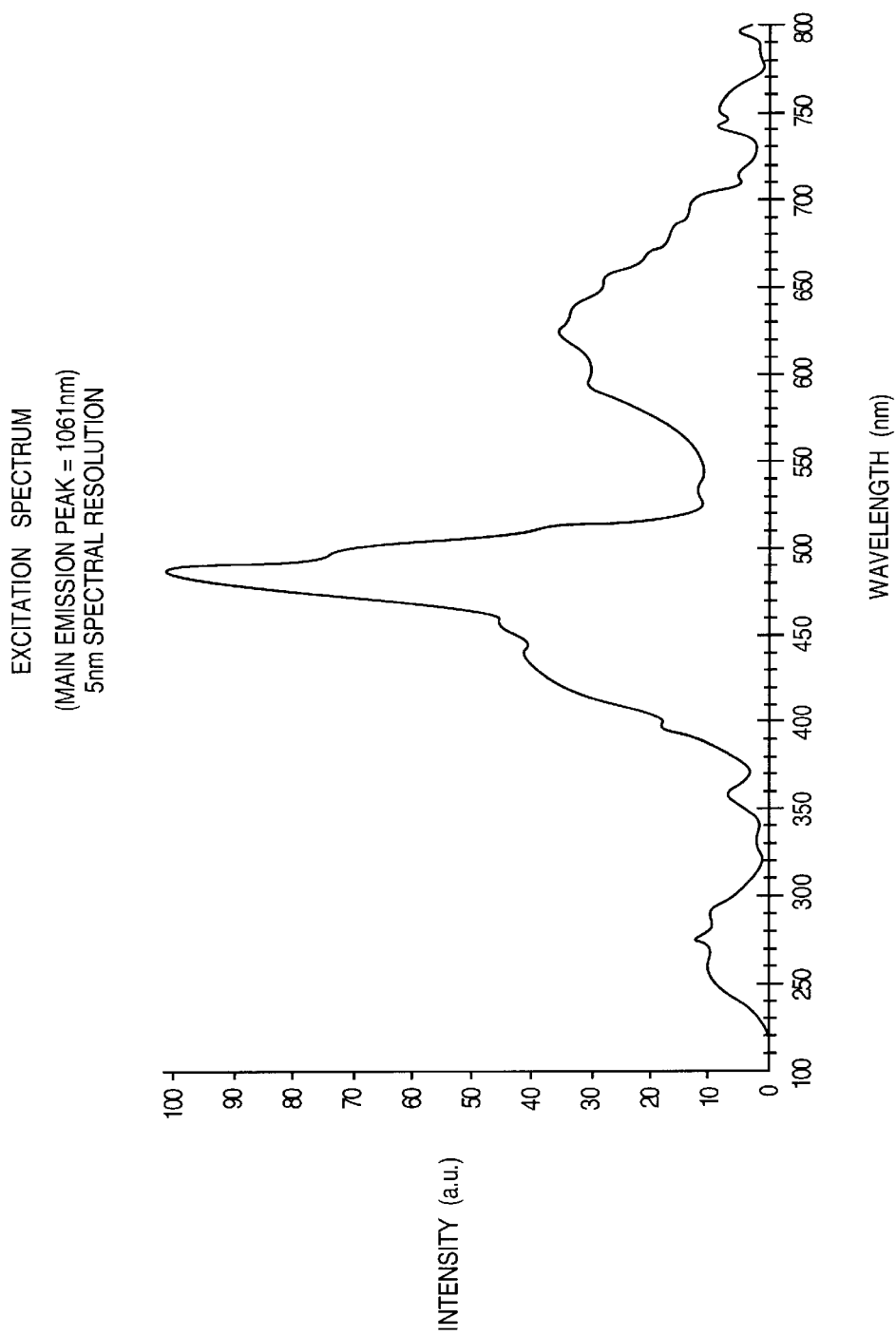
FIG. 6 illustrates an excitation spectrum of a phosphor used in one embodiment of the invention.
Figure 7:
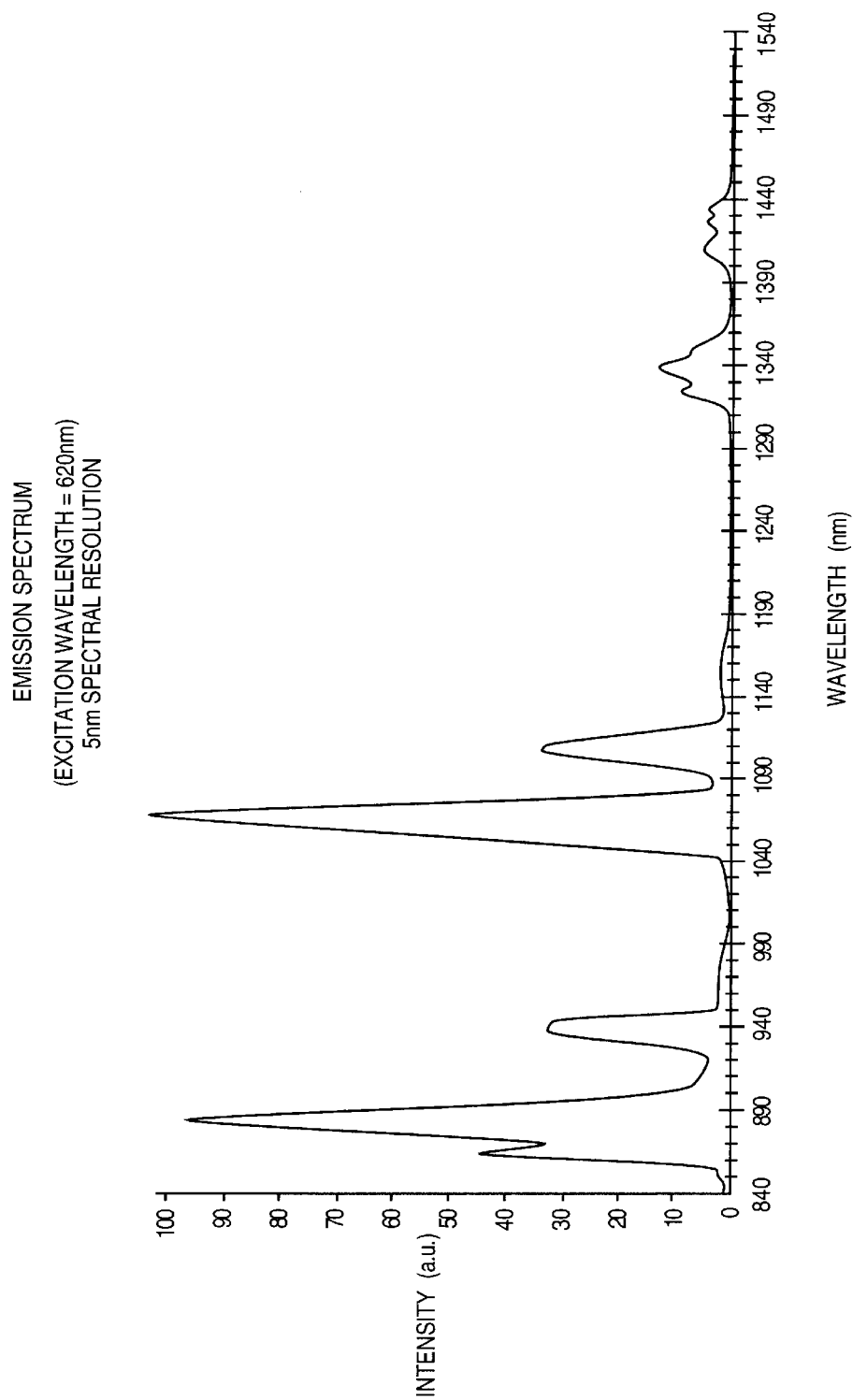
FIG. 7 illustrates an emission spectrum of the phosphor above used in the above embodiment of the invention.

FIGS. 6 and 7 illustrate a characteristic of an excitation spectrum and an emission spectrum of a phosphor. Ideally, it is desirable that the phosphor has an excitation spectrum in the range of 400–700 nanometers. For the emission spectrum, it is desirable to emit in the wavelength of 900–1000 nanometers. The excitation and the emission spectrum shown in FIGS. 6 and 7 correspond to a phosphor UMPKC60#5296 available from Phosphor Technology located in Essex, England.

Figure 8:
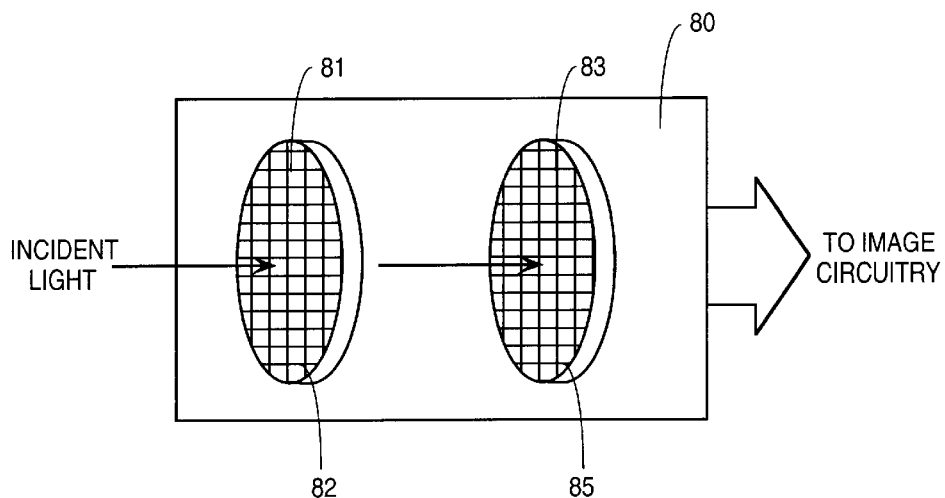
FIG. 8 illustrates a CMOS image sensor comprising a phosphor layer and a pixel array in accordance with an embodiment of the invention.

FIG. 8 illustrates a CMOS image sensor in accordance with another embodiment of the invention. The CMOS sensor 80 comprises a pixel array 83 and a phosphor layer 81. Photons that strike the pixel array 83 is first absorbed by the phosphor layer 81 and re-radiated in the infra-red wavelength where the image sensor 80 can operate at optimal quantum efficiency. In this configuration, a color filter array is not used. The phosphor layer 81 comprises a plurality of phosphor dots 82, each dot 82 corresponding to a pixel 85 in the pixel array 83. Each phosphor dot 82 absorbs photons of a particular wavelength in the visible spectrum and re-radiates photons of a wavelength in the infra-red spectrum. In this manner, the phosphor layer 81 performs the color separation. Stated differently, the position of each phosphor that absorbs a particular wavelength (i.e., red, green or blue) in the phosphor layer determines the RGB pattern to be captured by the pixels in the pixel array. Because each phosphor dot absorbs only a wavelength and emits in the infra-red wavelength, a color filter array is no longer required.

One advantage of using a phosphor layer is that the time domain may be adjusted such that the phosphor absorbs photons and re-radiates at a longer period of time. This allows the pixels of the pixel array to be exposed to a particular image for a longer period of time. The sampling time of a CMOS sensor can be adjusted to accommodate for the extended time, allowing for fuller penetration of the incident photons into the surface of the pixel array.

Figure 9:
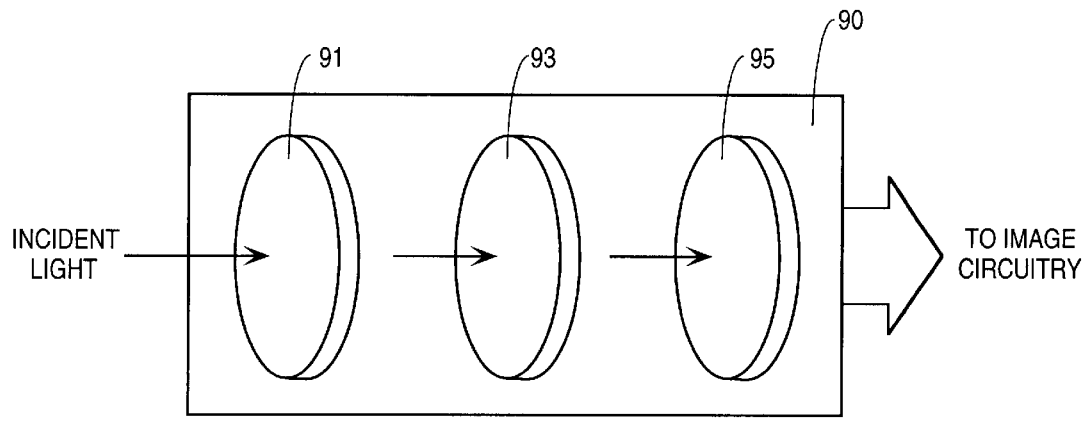
FIG. 9 illustrates a CMOS image sensor comprising an isotropic emissions reflector, a phosphor layer and a pixel array in accordance with an embodiment of the invention.

FIG. 9 illustrates a CMOS image sensor 90 in accordance with an embodiment of the invention. In this embodiment, the image sensor 90 comprises an isotropric emissions reflector 91, a phosphor layer 93 and a pixel array 95. The role of the isotropic emissions reflector is as follows: Generally, incident light entering the CMOS image sensor has an infra-red wavelength component. The infra-red wavelength component interferes with the RGB pattern generated by the pixel array 95 in that the infra-red wavelength photons converted by the phosphor layer 93 is indistinguishable from the infra-red wavelength component of the incident light. The isotropic emissions reflector filters the infra-red wavelength component of the incident light by reflecting it away from the phosphor layer 93. Another role of the isotropic emissions reflector 91 is that the phosphor layer generally emits the converted infra-red wavelength photons in both directions, that is, towards the pixel array 95 and also towards the isotropic emissions relfector 91. The isotropic emissions reflector 91 reflects the transmitted the infra-red wavelength photons back into the phosphor layer 93. Isotropic emissions reflectors are commercially available, for example, from OCLI located in Santa Rosa, Calif.

Figure 10:
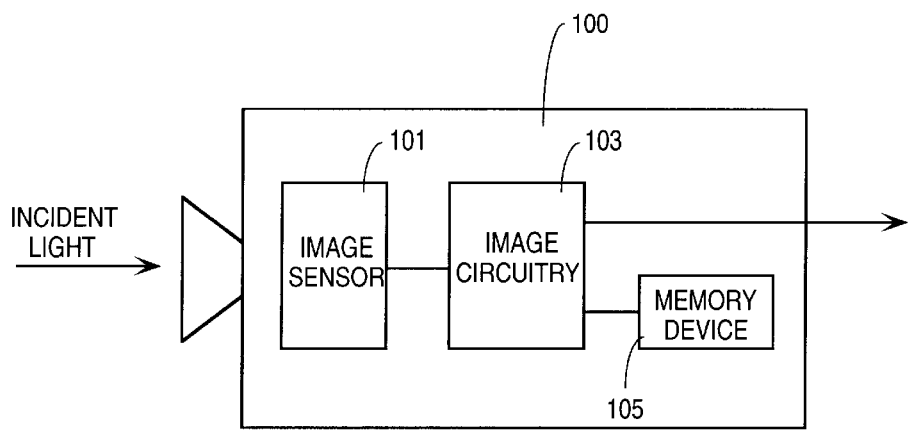
FIG. 10 illustrates an imaging device using a phosphor layer in accordance with an embodiment of the invention.

FIG. 10 illustrates an embodiment of a imaging system 100 in accordance with the present invention. The imaging system 100 may be, for example, a camcorder or a digital camera or any system that is related to digital processing. As shown in the figure, an image sensor 101 including a phosphor layer in accordance with the invention is coupled to an imaging circuitry 103 that is further coupled to a memory device 105. The memory device 105 may be semiconductor memories, magnetic disks or optical disks capable of storing images. The operation of the imaging system 100 is as follows: incident light containing an image falls on the image sensor 101 designed in accordance with the present invention. The image sensor 101 captures the image in a manner as described with respect to FIGS. 1 and 2. The charges generated by the pixels are sent to the imaging circuitry 103 for processing. The image represented by the electrical signals is processed by the imaging circuitry 103 and may be stored in the memory device 105 or transmitted out of the imaging system.

In the foregoing specification, the invention has been described with reference to specific embodiments thereof. It will, however, be evident that various modifications and changes can be made thereto without departing from the broader spirit and scope of the invention as set forth in the appended claims. The specification and drawings are accordingly, to be regarded in an illustrative rather than a restrictive sense.

What is claimed is:

1. An apparatus comprising:
    an image sensor;
    a phosphor layer adapted to said image sensor, wherein said phosphor layer converts incident photons in a first wavelength to photons in a second wavelength, wherein said first wavelength is in a range of 400 nm to 700 nm and said second wavelength is in a range of 900 nm to 1000 nm; and
    an isotropic emissions reflector capable of reflecting infra-red light and passing light in the first wavelength, wherein said phosphor layer is positioned between said isotropic emissions reflector and said image sensor.

2. An apparatus as in claim 1, wherein said image sensor having a pixel array, each pixel adapted to convert incident photons into an electrical signal.

3. An apparatus as in claim 1, wherein said phosphor layer shifts said incident photons in a first time domain to a second time domain.

4. An apparatus as in claim 1, further comprising a color filter array wherein said phosphor layer is positioned between said color filter array and said pixel array.

5. An apparatus as in claim 2, further comprising a plurality of microlenses, wherein said phosphor layer is located between said microlenses and said pixel array.

6. An apparatus as in claim 2, wherein said pixel array is a passive pixel array.

7. An apparatus as in claim 2, wherein said pixel array is an active pixel array.

8. A method comprising:
    providing an image sensor;
    positioning a phosphor layer corresponding to said image sensor, wherein said phosphor layer converts incident photons in a first wavelength to photons in a second wavelength, wherein said first wavelength is in a range of 400 nm to 700 nm and said second wavelength is in a range of 900 nm to 1000 nm; and
    positioning an isotropic emissions reflector capable of reflecting infrared light and passing light in the first wavelength such that said phosphor layer is between said isotropic emissions reflector and said image sensor.

9. A method comprising:
    providing an image sensor;
    positioning a phosphor layer corresponding to said image sensor, wherein said phosphor layer converts incident photons in a first wavelength to photons in a second wavelength;
    positioning an isotropic emissions reflector capable of reflecting infrared light and passing light in the first wavelength such that said phosphor layer is between said isotropic emissions reflector and said image sensor;
    absorbing photons in the phosphor layer of said first wavelength in a range of 400 nm to 700 nm; and
    re-radiating photons from the phosphor layer of said second wavelength in the range of 900 nm to 1000 nm.

10. A method as in claim 8, wherein said phosphor layer is absorbing photons in a first-time domain; and
    re-radiating photons in a second time domain.

11. A method as in claim 8, further comprising:
    positioning a color filter array such that said phosphor layer is between said color filter array and said image sensor.

12. A method as in claim 8, further comprising:
    positioning a plurality of microlenses such that said phosphor layer is between said microlenses and said image sensor.

13. A system comprising:
    a memory device;
    an image sensor;
    a phosphor layer within said image sensor, wherein said phosphor layer converts incident photons in a first wavelength to photons in a second wavelength wherein said first wavelength is in a range of 400 nm to 700 nm and said second wavelength is in a range of 900 nm to 1000 nm;
    an isotropic emissions reflector capable of reflecting infra-red light and passing light in the first wavelength, wherein said phosphor layer is positioned between said isotropic emissions reflector and said image sensor; and an imaging circuitry coupled to said image sensor and said memory device, said imaging circuitry configured to process electrical signals received from said image sensor and further configured to store said processed electrical signals in said memory device.

14. A system as in claim 13, wherein said image sensor having a pixel array, each pixel adapted to convert incident photons into an electrical signal.

15. A system as in claim 13, wherein said phosphor layer shifts incident photons in a first time domain to a second time domain.

16. A system as in claim 13, further comprising a color filter array, wherein said phosphor layer is positioned between said color filter array and said image sensor.

17. A system as in claim 14, further comprising a plurality of microlenses, wherein said phosphor layer is positioned between said microlenses and said pixel array.

18. A system as in claim 14, wherein said pixel array is a passive pixel array.

19. A system as in claim 14 wherein said pixel array is an active pixel array.

* * * * *